United States Patent

Mousaa

Patent Number: 5,772,445
Date of Patent: Jun. 30, 1998

[54] ELECTROSTATIC METER

[76] Inventor: Victor Roland Mousaa, 250 Riverside Dr., Apt. 62, New York, N.Y. 10036

[21] Appl. No.: 679,257

[22] Filed: Jul. 12, 1996

Related U.S. Application Data

[60] Provisional application No. 60/001,119 Jul. 13, 1995.

[51] Int. Cl.[6] .......................... G09B 23/18; G01R 31/02; G01R 29/12; G01R 1/04
[52] U.S. Cl. ...................... 434/301; 324/72; 324/156; 324/457
[58] Field of Search ...................... 434/300, 301; 324/72, 109, 234, 228, 239, 262, 156, 457

[56] References Cited

U.S. PATENT DOCUMENTS

| | | | |
|---|---|---|---|
| 1,705,560 | 3/1929 | Edwards | 324/109 |
| 3,371,433 | 3/1968 | Ruchlis | 434/301 |
| 3,638,119 | 1/1972 | Mackenzie | 324/156 |
| 3,771,152 | 11/1973 | Dettling | 340/258 |
| 3,774,110 | 11/1973 | Roveti | 324/133 |
| 3,997,840 | 12/1976 | Pearson | 324/156 |
| 4,127,806 | 11/1978 | Shuey | 324/32 |
| 4,316,180 | 2/1982 | LeVert | 340/562 |
| 4,321,546 | 3/1982 | Schneider | 324/457 |
| 4,891,576 | 1/1990 | Jacobs | 324/72 |
| 5,184,064 | 2/1993 | Vicknair | 324/156 |
| 5,231,346 | 7/1993 | Gassmann | 324/95 |
| 5,300,889 | 4/1994 | Bakhoum | 324/457 |
| 5,350,999 | 9/1994 | Brunda | 324/72 |

FOREIGN PATENT DOCUMENTS

| | | | |
|---|---|---|---|
| 1504669 | 8/1989 | U.S.S.R. | 434/301 |

*Primary Examiner*—Richard J. Apley
*Assistant Examiner*—Ira R. Hatton
*Attorney, Agent, or Firm*—Goldstein & Associates

[57] ABSTRACT

An apparatus for detecting and measuring disturbances in an electromagnetic field caused by the electrostatic potential of a charged object moving the field includes a DC source, a loop/solenoid coil, and a metering unit. The DC source charges the loop/solenoid coil, and thereby creates the electromagnetic field that emanates from the coil. The metering unit is provided to (indirectly) sense and quantify the disturbances in the electromagnetic field of the loop/solenoid coil by indicating a change in a current flow through the coil. The apparatus may be configured with a housing to enclose a plurality of components of the apparatus including the DC source, the loop/solenoid coil, and the metering unit.

8 Claims, 3 Drawing Sheets

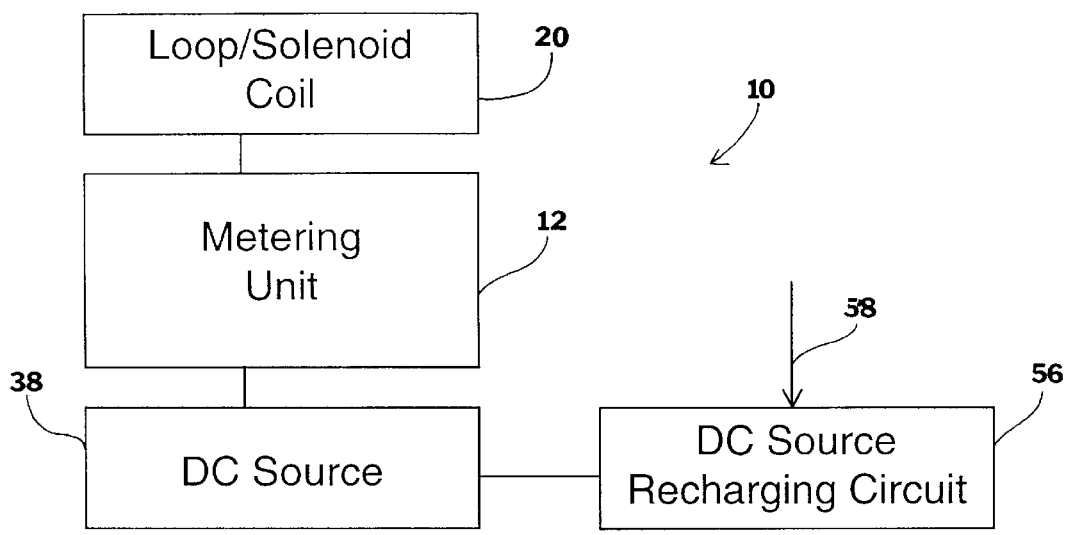
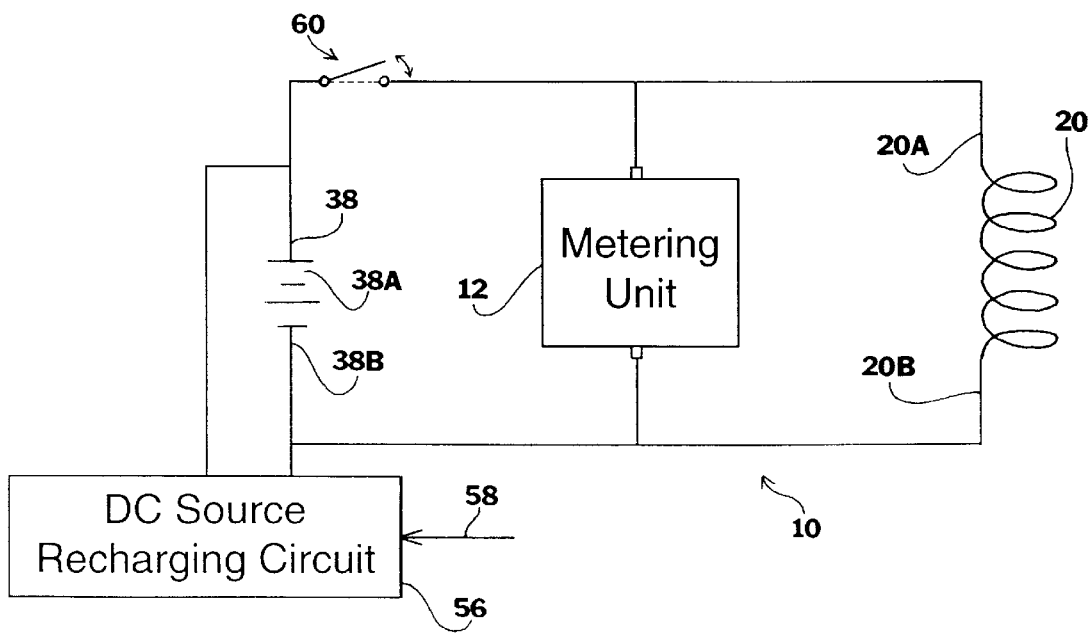

ELECTROSTATIC METER

CROSS REFERENCES

This Application relates to subject matter filed in the United States Patent and Trademark Office on Jul. 13, 1995, in provisional application Ser. No. 60/001,119.

BACKGROUND OF THE INVENTION

1. Field of the Invention

The invention relates to educational scientific devices, and more particularly, the invention relates to a simple, portable, and selfcontained demonstration system for detecting and measuring disturbances in electromagnetic fields caused by the electrostatic potential of electrically charged objects, including humans.

2. Background and Objects of the Invention

The fundamental concepts and theories of basic electricity and magnetism are well know in the art. Many inventors and scientists are responsible for the established art that is employed by electronic systems and instruments in operation today. These fundamental concepts and laws, which must be studied by persons wishing to learn and understand electricity and electronics, include work by Benjamin Franklin (1706–1790) who first proposed the existence of positive and negative charges and discovered the relationship between electrostatic force and conducting (lightning) rods, Alessandro Volta (1745–1827) who invented the "voltaic pile" (i.e. the DC battery), and Andre Ampere (1775–1836) who discovered magnetic fields were created in and around conductive wires connected across DC cells. These fundamental phenomenon and concepts, as well as others discovered by Faraday, Henry, Hertz, Coulomb, Maxwell, and others, are typically studied and utilized by students of electricity and electronics.

The use of educational devices to demonstrate electrical and electronic principles is also well known in the art. However, due to the "invisible" nature in which electrical and electronic devices implement their functions, it is difficult to demonstrate and discuss the underlying principles of such devices and systems, especially to young and novice individuals wherein the discussion must be limited in complexity. In order to educate such young and novice individuals, educational systems that provide for an interactive discussion and demonstration, possibly having a "gee-whiz" nature, are desired. For example, employing simple arrangements such as magnets and iron filings to discuss and demonstrate the existence of magnetic poles and fields, is a well established practice that grabs and interests a young audience. As another example, consider the use of an iron rod, an insulated coil of wire disposed around the iron rod, and a DC source (i.e. a battery) to create an electromagnet. It may be noted that this is not only an effective educational or teaching device, but is a "practical" arrangement employed in components of many commercial systems in use around the world. The need for devices to enable interesting interactive discussions and demonstrations is essential to the education of persons unfamiliar with the concepts and laws that govern basic electricity and electronics.

The field of electrostatics and charged particles is another area of electricity and electronics that may employ demonstration devices to introduce fundamental concepts and laws. One area not easily presented and discussed via demonstrations is that involving the use of charged loop/solenoid coils and their interaction with electrostatic charge. In particular, the use of a charged loop/solenoid coil to establish an electromagnetic field, and subsequently sensing and measuring disturbances produced by the electrostatic potential of electrically charged objects in motion or placed within the field, is desired. Accordingly, such devices should be able to grab the attention of an audience and enable a science educator to discuss and demonstrate the important properties to be examined.

Objects of the present invention are, therefore, to provide a new and improved scientific educational system for demonstrating the principles of charged loop/solenoid coils. The present invention having one or more of the following capabilities, features, and/or characteristics:

a portable self-contained demonstration system;

an educational device that may be employed to introduce the concepts and principles related to charged loop/solenoid coils and their relationship to electrostatic charge;

a system capable of sensing and measuring of the disturbances on an electromagnetic field induced by the electrostatic potential of electrically charged objects moving or placed within a region occupied by the field;

having a direct "readout" device to indicate the magnitude of the disturbances on the electromagnetic field;

constructed of simple and inexpensive off the shelf components.

The above listed objects, advantages, and associated novel features of the present invention will become more clear from the description and figures provided herein. Attention is called to the fact, however, that the drawings are illustrative only. Variations are contemplated as being part of the invention, limited only by the scope of the appended claims.

SUMMARY OF THE INVENTION

In accordance with the invention, an apparatus is disclosed for detecting and measuring disturbances in an electromagnetic field caused by an electrostatic potential of one or more electrically charged objects placed within, or moving within, a region occupied by said field. The apparatus includes a DC source having a positive terminal and a negative terminal and capable of supplying a DC power. A loop/solenoid coil is provided having a first terminal and a second terminal, and formed from an insulated conductor appropriately shaped to provide a plurality adjacently positioned coils of insulated wire. The loop/solenoid coil is connected across the DC source with the positive terminal of the DC source connected to the first terminal of the loop/solenoid coil, and the negative terminal of the DC source connected to the second terminal. Thereby placing a DC potential produced by the DC source across the loop/solenoid coil to charge and establish an electromagnetic field within the region that surrounds the coil. Also provided is a metering unit capable of sensing low level DC currents. The metering unit has a first terminal means that is connected to the positive terminal of the DC source and a second terminal means that is connected to the negative terminal. The metering unit is provided to detect and measure disturbances in the electromagnetic field of the loop/solenoid coil by indicating a change in a current flow through the coil.

The apparatus of the present invention may further include a housing to enclose a plurality of components of the apparatus including the DC source, the loop/solenoid coil, and the metering unit. The housing is comprised of a first shell portion composed of a transparent material and a second shell portion arranged to mate with the first shell portion. Together, when mated, the first and second shell portions establish an interior chamber. A support plate suitably positioned within the interior chamber is arranged to support a plurality of the components of the invention including the DC source and the metering unit. The metering unit is suitably supported by the support plate so as to enable the viewing of the metering unit (readout) through the transparent first shell portion. A base is also included to support the housing in a fixed orientation with respect to a supporting surface.

BRIEF DESCRIPTION OF THE DRAWINGS

In the drawings, like elements are depicted by like reference numerals. The drawings are briefly described as follows.

FIG. 3 is a block diagram of the embodiment of FIGS. 1 and 2.

FIG. 4 provides a schematic diagram of the embodiment of the invention as depicted in FIGS. 1 and 2, and diagrammed in FIG. 3.

DETAILED DESCRIPTION OF THE PREFERRED EMBODIMENTS

In the context of this disclosure a number of terms must be clearly defined. First, it should be understood that the term "region" as applied to the area around a loop/solenoid coil, is to be defined as the immediate area that surrounds the coil and is occupied by an electromagnetic field established by charging the coil. The terms "educational demonstration device" and "educational system" may be assumed to be equivalents. Further, the terms "loop/solenoid coil" and "coil" are to be assumed to mean an inductive component constructed by forming a plurality of loops using an insulated wire, the loops being adjacently positioned in very close proximity and substantially aligned along a single given axis.

Figure 1:
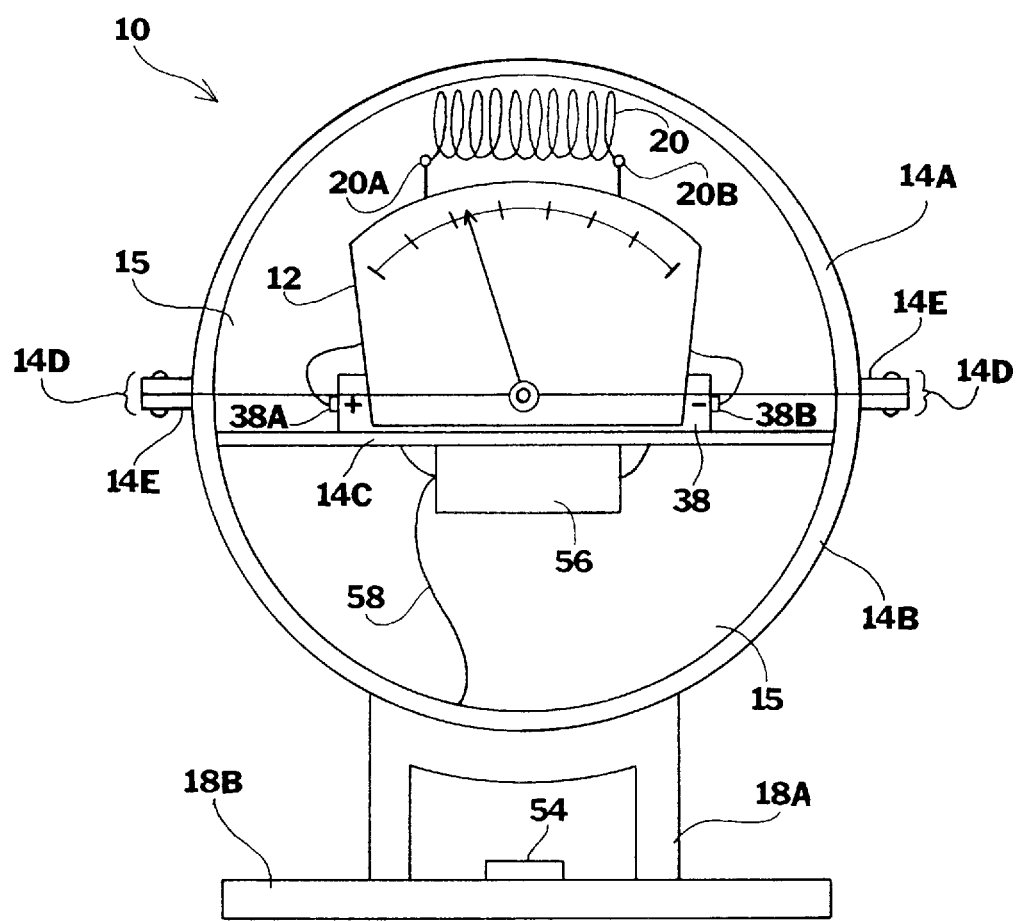
FIG. 1 illustrates a front view of an embodiment of a human electrostatic meter in accordance with the invention.
Figure 2:
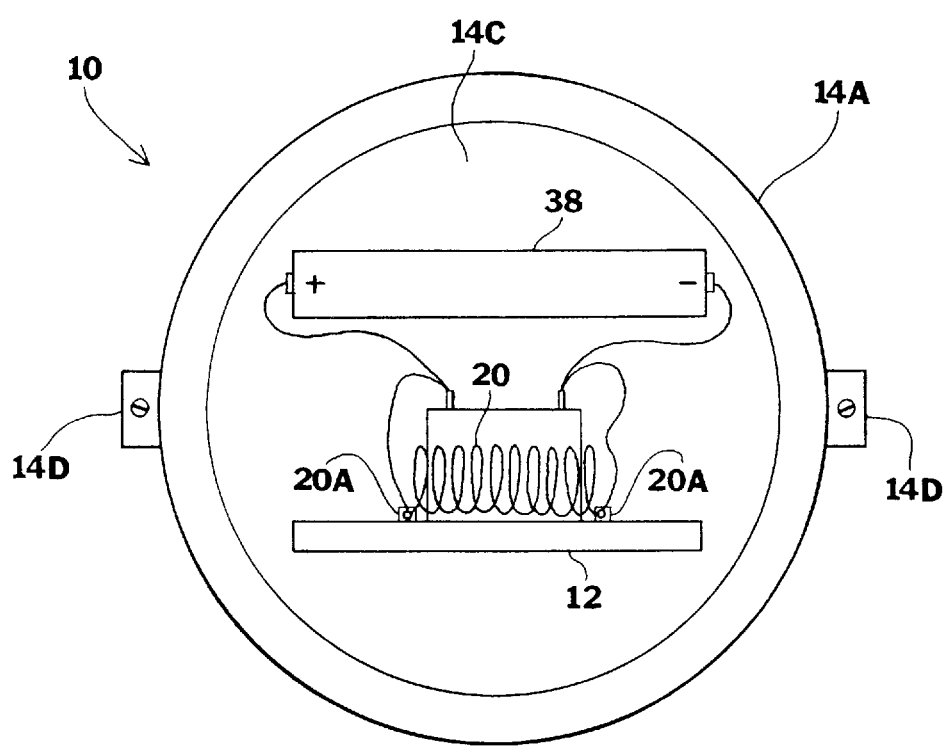
FIG. 2 is a top view of the embodiment of the human electrostatic meter of FIG. 1.

Referring now to FIGS. 1 and 2, there is illustrated an embodiment of an electrostatic meter 10 configured in accordance with the present invention. As shown, the electrostatic meter 10 includes a metering unit 12, with a loop/solenoid coil 20 and a DC source 38, all of which are electrically connected in parallel. The DC source 38, having a positive terminal 38a and a negative terminal 38b, will provide a power source to establish a "minute pressure" (i.e. a small voltage) across the loop/solenoid coil 20 (and the metering unit 38). The loop/solenoid coil 20 includes a first terminal 20a and a second terminal 20b, and is produced from a length of insulated conductive wire, preferably composed of copper, forming a plurality adjacently positioned coils (of the insulated wire), with the centers of the loops approximately concentricity aligned along a single axis. The loop/solenoid coil 20 is electrically connected across the DC source 38 with the positive terminal 38a of the DC source connected to the first terminal 20a of the loop/solenoid coil 20, and the negative terminal 38b of the DC source 38 connected to the second terminal 20b (of the coil 20). Therefore, inducing a DC potential across the loop/solenoid coil 20, and is essentially applying a "bias" to charge the coil 20. It may be noted that the coil 20 does not have a polarity associated therewith, and accordingly may be connected as shown in FIG. 1, or alternately with the first terminal 20a and the second terminal 20b "reversed". (That is, with an orientation wherein the first terminal 20a is connected to the negative terminal 38b of the DC source 38.) The bias (pressure) applied to the coil 20 will cause an electromagnetic field to be produced by charging the coil 20. The electromagnetic field established by the coil 20 will provide a sensitivity to, and enable the detection of, nearby electrically (or electrostatically) charged objects that are within the region the electromagnetic field occupies. Essentially, the loop/solenoid coil will act as an "antenna" and detect the electromagnetic field disturbances. The loop/solenoid coil 20 would be constructed to have a suitable number of "loops", formed with an appropriate gauge conductive wire, in order to provide an adequate resistance to prevent an excessive current to flow through the coil 20 when the DC source 38 is connected in parallel. In addition, the number of loops provided with the coil 20 will also affect the sensitivity of the present invention when detecting electrostatically charged objects. The metering unit 12, which is capable of sensing "low level" DC currents, is provided to detect and quantify (measure) disturbances in the electromagnetic field of the coil 20 by indicating a change in the current flow through the coil 20. It in important to note that since the metering unit 12 and the loop/solenoid coil 20 are connected in parallel, should the current flowing through the coil 20 decrease, the current indicated by the metering unit 12 would increase. Accordingly, when an electrostatically charged object is placed within, or moves within, the region (occupied by the electromagnetic field of the coil 20), the electromagnetic field is disturbed, resulting in a deviation of the constant current flowing through the coil 20. This deviation would be detected by the metering unit 12. The term low level DC currents may be assumed to indicate electrical currents in the range of 0 to 1 microamperes. Therefore, the metering unit 12 may be provided by a 1 microampere meter movement.

Also shown in FIG. 1 is a DC recharging circuit 58, which may be included with electrostatic meter 10 when the DC source 38 is provided by a rechargeable battery, preferably a Ni-Cad type of battery. Since the electrostatic meter 10 is contemplated to be a portable and self contained unit, the use of one of more rechargeable battery cells will mean that the meter 10 may be "recharged" when not being used.

A housing is included with the electrostatic meter 10 to enclose a plurality of the components of the electrostatic meter 10 (including the loop/solenoid coil 20, the DC source 38, and the metering unit 12) as illustrated in FIGS. 1 and 2. The Housing is comprised of a first shell portion 14a and a second shell portion 14b. When properly mated, as shown, the first shell portion 14a and second shell portion 14b establish an interior chamber 15. The housing further includes a support plate 14c, a support means 18a and a base 18b. The support plate 14c is included and suitably positioned within the interior chamber 15, and arranged to support the plurality of components of the invention. The support plate may be fixed (as shown in FIG. 1) to the second shell portion 14b in any suitable manner, including a "press fit" or by using a suitable glue. In a preferred embodiment the support plate 14c will be provided by a mirrored plastic disk, the first shell portion would be provide by a transparent material, and the second shell portion would be provided by an opaque (e.g. silver colored) material. Also shown in FIGS. 1 and 2 are fastening means 14d including tabs 14e, which are provided to secure the first shell portion 14a to the second shell portion 14b. As skilled individuals will appreciate, many differing fastening means 14d may be employed with the present invention.

Returning to FIG. 1, the first and second shell portions, 14a and 14b respectively, are supported by support means 18a and base 18b. In a preferred embodiment the support means 18a would be provided by a cylindrical tube of suitable diameter, having the opposite side walls cut out or removed (as shown in FIG. 1), and fixed to the second shell portion-14b. The base 18b may be fixed to the support means 18a, or preferably the base may include a circular groove or channel (not shown) that would enable the support means 18a to mate with the channel and thereby provide a simple arrangement to enable the rotation of the upper housing portion (comprised of the first shell portion 14a, the second shell portion 14b, and the support means 18a) with respect to the base 18. As shown in FIG. 1 a compass 54, which may be mounted concentricity on the base, is included to enable the electrostatic meter 10, and in particular the loop/solenoid coil 20, to be oriented with respect to the magnetic north pole of the earth. For example, if an operator of the electrostatic meter 10 desired to align the meter 10 or the coil 20 with a (true) north-south orientation, the upper housing S portion may be rotated (with respect to the base 18b) until the desired orientation is realized.

It should be noted that the embodiment of FIGS. 1 and 2 is intended to be illustrative only. For example, variations to the shape of the housing and the material utilized to construct it are contemplated, and may be provided by skilled persons.

Referring now to FIGS. 3 and 4, there are illustrated a block diagram and schematic diagram of the present invention, respectively. As shown, the electrostatic meter 10 is comprised of the loop/solenoid coil 20, the metering unit 12, and the DC source 38, and may further include the DC source recharging circuit 56. As discussed herein, and illustrated in FIG. 4, the coil 20, the metering unit 12, and the DC source 38 are connected in a parallel arrangement. However, as illustrated in FIG. 4, an on-off switch 60 may also be included to enable an individual to selectively connect and disconnect the DC source 38 and the parallel combination of the metering unit 12 and the coil 20—thereby providing an "on-off switch". Also shown in FIGS. 3 and 4, is the DC source recharging unit 56, which may be included with the electrostatic meter 10 if the DC source 38 is provided by a suitable rechargeable battery, preferably a Ni-Cad type battery. An external power source 58 may be electrically coupled to the recharging unit 56 to supply an external source of power for recharging a rechargeable embodiment of the DC source 38.

While there have been described the currently preferred embodiments of the present invention, those skilled in the art will recognize that other and further modifications may be made without departing from the present invention and it is intended to claim all modifications and variations as fall within the scope of the invention.

What is claimed is:

1. An apparatus for detecting and measuring disturbances in an electromagnetic field caused by an electrostatic potential of an electrically charged object within a region occupied by the electromagnetic field, the apparatus comprising:

(a) a DC source having a positive terminal and a negative terminal and capable of supplying a DC power;

(b) a loop/solenoid coil having a first terminal and a second terminal, and embodied from an insulated conductor forming a plurality adjacently positioned coils of insulated wire, the loop/solenoid coil connected across the DC source with the positive terminal of the DC source connected to the first terminal of the loop/solenoid coil and the negative terminal of the DC source connected to the second terminal; thereby providing a DC potential to charge the loop/solenoid coil and establish the electromagnetic field within the region; and (c) a metering unit capable of sensing low level DC currents, the metering unit having a first terminal means connected to the positive terminal of the DC source and a second terminal means connected to the negative terminal, the metering unit provided to detect and measure disturbances in the electromagnetic field of the loop/solenoid coil by indicating a change in a current flow through the loop/solenoid coil.

2. The apparatus according to claim 1, further including a housing to enclose a plurality of components of the apparatus including the DC source, the loop/solenoid coil, and the metering unit, the housing comprised of:

(a) a first shell portion composed of a transparent material;

(b) a second shell portion arranged to mate with the first shell portion to establish an interior chamber;

(c) a support plate suitably positioned within the interior chamber and arranged to support a plurality of the components including the DC source and the metering unit so as to enable the viewing of the metering unit through the transparent first shell portion; and (d) a base to support the housing in a fixed orientation with respect to a supporting surface.

3. The apparatus according to claim 2, further including a compass mounted on the base of the housing, the compass provided to enable the orientation of the apparatus with respect to the magnetic north pole of the earth.

4. The apparatus according to claim 2 wherein the first and second shell portions are each provided by hemispherically shaped domes, which when mated together provide a spherically shaped chamber.

5. The apparatus according to claim 1, wherein the DC source is provided by a battery.

6. The apparatus according to claim 5, wherein the battery is a rechargeable battery.

7. The apparatus according to claim 6, further including a recharging unit to recharge the rechargeable battery.

8. The apparatus according to claim 1, wherein the metering unit is provided by a DC microampere meter having a 0 to 1 microampere movement.

* * * * *